(12) United States Patent
Angelov et al.

(10) Patent No.: US 12,683,621 B2
(45) Date of Patent: Jul. 14, 2026

(54) DRIVER CIRCUIT

(71) Applicant: Telefonaktiebolaget LM Ericsson (publ), Stockholm (SE)

(72) Inventors: Pavel Angelov, Ljungsbro (SE); Niklas Andersson, Liköping (SE); Sunny Sharma, Limhamn (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 75 days.

(21) Appl. No.: 18/712,434

(22) PCT Filed: Dec. 16, 2021

(86) PCT No.: PCT/EP2021/086346
§ 371 (c)(1),
(2) Date: May 22, 2024

(87) PCT Pub. No.: WO2023/110111
PCT Pub. Date: Jun. 22, 2023

(65) Prior Publication Data
US 2025/0015810 A1     Jan. 9, 2025

(51) Int. Cl.
H03M 1/00 (2006.01)
H03K 3/037 (2006.01)
(Continued)

(52) U.S. Cl.
CPC .......... H03M 1/0863 (2013.01); H03K 3/037 (2013.01); H03M 1/0624 (2013.01); H03M 1/742 (2013.01)

(58) Field of Classification Search
CPC ............. H03K 3/356121; H03K 3/012; H03K 3/0375; H03K 2005/00286;
(Continued)

(56) References Cited

U.S. PATENT DOCUMENTS

| | | | |
|---|---|---|---|
| 5,179,295 | A | 1/1993 | Mattison et al. |
| 5,767,717 | A | 6/1998 | Schorn et al. |

(Continued)

OTHER PUBLICATIONS

Doris, K., et al., "A 12b 500MS/s DAC with >70dB SFDR up to 120MHz in 0.18μm CMOS", ISSCC 2005 / Session 6 /High-Speed and Oversampled DACs / 6.4, 2005 IEEE International Solid-State Circuits Conference, Feb. 7, 2005, pp. 116-117 and 588.
(Continued)

*Primary Examiner* — Linh V Nguyen
(74) *Attorney, Agent, or Firm* — Murphy, Bilak & Homiller, PLLC

(57) ABSTRACT

A single ended driver circuit (100) for a digital to analog conversion, DAC, cell is presented. The driver circuit (100) comprises one positive single-edge latch (200) configured to provide a positive edge latched data signal ($S^+$) by latching a positive edge of a data signal (D) synchronized by a first clock signal ($CLK_1$), and a negative single-edge latch (300) configured to provide a negative edge latched data signal ($S^-$) by latching a negative edge of the data signal (D) synchronized by a second clock signal ($CLK_2$). The positive edge latched data signal ($S^+$) and the negative edge latched data signal ($S^-$) are combined to provide a drive signal (S) having a positive edge synchronized by the first clock signal ($CLK_1$) and a negative edge synchronized by the second clock signal ($CLK_2$). The positive single-edge latch (200) and the negative single-edge latch (300) are also presented.

17 Claims, 7 Drawing Sheets

(51) Int. Cl.
　　*H03M 1/06*　　　　(2006.01)
　　*H03M 1/08*　　　　(2006.01)
　　*H03M 1/74*　　　　(2006.01)

(58) Field of Classification Search
　　CPC ............. H03K 3/356113; H03K 5/135; H03K
　　　　　　　2005/00052; H03K 3/356156; H03K
　　　　　　3/356165; H03K 3/356173; H03K 5/249;
　　　　　　　H03K 19/0013; H03K 19/0948; H03K
　　　　　　3/00; H03K 3/037; H03K 3/35606; H03K
　　　　　　　3/356104; H03K 3/356191; H03K
　　　　　　　3/35625; H03K 5/01; H03K 5/05; H03K
　　　　　　　5/06; H03K 5/065; H03K 5/088; H03K
　　　　　　　5/13; H03K 5/134; H03K 5/1515; H03K
　　　　　　　5/1565; H03K 5/2481; H03M 1/0863;
　　　　　　　H03M 1/46; H03M 1/466; H03M 1/742;
　　　　　　　H03M 1/76; H03M 3/324; H03M 3/464;
　　　　　　　　　　　　　　　　　　　H03M 9/00
　　USPC .......................................... 341/134–136, 144
　　See application file for complete search history.

(56)　　　　　　References Cited

U.S. PATENT DOCUMENTS

| | | | |
|---|---|---|---|
| 6,426,652 B1 * | 7/2002 | Greenhill ........... | H03K 19/0948 |
| | | | 326/119 |
| 8,525,566 B2 * | 9/2013 | Dixit .................... | H03K 3/0375 |
| | | | 327/218 |
| 8,593,193 B1 * | 11/2013 | Bazes .............. | H03K 3/356121 |
| | | | 327/202 |
| 9,257,972 B1 * | 2/2016 | Pham ............... | H03K 3/356121 |
| 9,350,335 B1 * | 5/2016 | Lovitt .............. | H03K 3/356113 |
| 9,401,715 B1 * | 7/2016 | Tripathi ............. | H03K 19/0013 |
| 9,438,211 B1 * | 9/2016 | Chong ................... | H03K 3/012 |
| 9,912,338 B1 * | 3/2018 | Dodrill ............... | H03K 3/0375 |
| 9,929,741 B1 * | 3/2018 | Hsia ...................... | H03M 1/742 |
| 2002/0036577 A1 * | 3/2002 | Volk .................... | H03M 1/0624 |
| | | | 341/136 |
| 2008/0180139 A1 * | 7/2008 | Natonio ............. | H03K 3/35625 |
| | | | 327/218 |
| 2010/0164576 A1 * | 7/2010 | Masleid .......... | H03K 3/356173 |
| | | | 327/161 |
| 2020/0076446 A1 | 3/2020 | Egan | |

OTHER PUBLICATIONS

Doris, K., "High-speed D/A converters: from analysis and synthesis concepts to IC implementation", Technische Universiteit Eindhoven, https://doi.org/10.6100/IR582609, Jan. 1, 2004, pp. 1-156.

Doris, Konstantinos, et al., "Mismatch-based timing errors in current steering DACs", IEEE, 2003, pp. I-977-I-980.

Kim, Jaekwon, et al., "A 12-b, 1-GS/s 6.1 mW Current-Steering DAC in 14 nm FinFET with 80 dB SFDR for 2G/3G/4G Cellular Application", RMO4B-1, 2017 IEEE Radio Frequency Integrated Circuits Symposium, 2017, pp. 248-251.

Lee, Tzung-Je, et al., "A 10-bit 400-MS/s Current-Steering DAC with Process Calibration", 2013 IEEE International Conference on Circuits and Systems, 2013, pp. 23-26.

Lin, Chi-Hung, et al., "A 12 bit 2.9 GS/s DAC With IM3 < -60 dBc Beyond 1 GHz in 65 nm Cmos", IEEE Journal of Solid-State Circuits, vol. 44, No. 12, Dec. 2009, pp. 3285-3292.

Luo, Fang-Jie, et al., "Current Switch Driver and Current Source Designs for High-speed Current-steering DAC", IEEE Xplore, 2008 2nd International Conference on Anti-counterfeiting, Security and Identification, Guiyang, China, 2008, pp. 1-4.

Ravinuthula, Vishnu, et al., "A 14-bit 8.9GS/s RF DAC in 40nm CMOS achieving >71dBc LTE ACPR at 2.9GHZ", 2016 IEEE Symposium on VLSI Circuits (VLSI-Circuits), Honolulu, HI, USA, 2016, pp. 1-2.

Samanta, Smrutilekha, et al., "A 1.8 V 8-bit 500 MSPS Segmented Current Steering DAC with > 66 dB SFDR", 2020 IEEE Computer Society Annual Symposium on VLSI (ISVLSI), 2020, pp. 13-17.

Sarkar, Santanu, et al., "A 10-bit 500 MSPS Segmented DAC with Optimized Current Sources to Avoid Mismatch Effect", 2015 IEEE Computer Society Annual Symposium on VLSI, 2015, pp. 172-177.

Schofield, W., et al., "7.1 A 16b 400MS/s DAC with <-80dBc IMD to 300MHz and <-160dBm/Hz Noise Power Spectral Density", ISSCC 2003 / Session 7 / DACs and AMPs / PAPER 7.1, 2003, pp. 1-10.

Tang, Yongjian, et al., "Predictive Timing Error Calibration Technique for RF Current-Steering DACs", IEEE, 2008, pp. 228-231.

Van Bavel, Nicholas, "A 325 MHz 3.3V 10-Bit CMOS D/A Converter Core With Novel Latching Driver Circuit", IEEE 1998 Custom Integrated Circuits Conference, 1998, pp. 245-248.

* cited by examiner

DRIVER CIRCUIT

TECHNICAL FIELD

The present disclosure relates to a driver circuit, and more precisely to a low timing uncertainty switch driver circuit for current steering DACs.

BACKGROUND

The conversion of signals from the digital domain to the analog domain is a task generally performed by digital-to-analog converters (DACs). DACs are used in electronic equipment of all fields where there is a need to convert a digital signal to an analog signal. Within many of these fields, there is a demand for increased bandwidth and e.g. wireless communication standards such as 5G and beyond are likely to use ever higher bandwidth and carrier frequencies compared to current standards. This evolution poses stringent requirements on the DACs used in e.g. transmitters as they need to maintain high linearity, high SNR, low levels of spurs, and other emission contributions in the output signal spectrum. Sampling rates reaching 10's of GHz may be needed to generate high bandwidth baseband transmitter signals or even the RF signal directly and thereby enabling bypassing of the up-conversion in the analog domain altogether. Such high capability DACs are anything but trivial to design and they are paired with extremely tight requirements on every sub-block.

As is generally known for a binary-scaled current steering DAC, a set of binary signals $d_n$, $d_{n+1}$, $d_{n+2}$, ... serve as input to the DAC. Each binary signal $d_n \in \{-1,1\}$ is driving an associated DAC cell and weighted by a corresponding weight $w_n$ of the DAC cell. The DAC cells inputs are updated in synchrony, usually to a reference clock signal, such that the DAC cells are only ever configured to output analog levels corresponding to the input binary signals—this is known as glitch-free operation. A delay through any given logic circuitry is dependent on a combination of circuit parameters, e.g. device size, threshold voltages, driving strength, output load and self-load, input slew rate etc. The input slew rate means that the delay through a given gate depends not only on its intrinsic parameters, but also, on how its inputs are driven. Therefore, since the circuit parameters vary randomly for each die, in order to minimize the delay variation of otherwise identical chains of CMOS gates, it is important to minimize both the number of devices involved as well as the number of intermediate nodes that have to transition. Spread in delay between DAC cells will introduce glitches when the binary signal is updated, i.e. changes state. Furthermore, it is generally known that, in order to maintain an operating point of a reference current generator used to drive a DAC cell, and therefore, the linearity of a DAC, it is necessary to ensure that a conduction path for the reference current is maintained at all times. In "A 12-b, 1-GS/s 6.1 mW current-steering DAC in 14 nm FinFET with 80 dB SFDR for 2G/3G/4G cellular application," by J. Kim, W. Jang, Y. Lee, S. Oh, J. Lee and T. Cho, published in 2017 IEEE Radio Frequency Integrated Circuits Symposium (RFIC), 2017, pp. 248-251, a differential driver circuit is presented wherein switches controlling the data latching are both closed simultaneously for a brief moment when the input code to a DAC cell changes. The task of the switch driver is to ensure that the switch control signals overlap in time during their on-state. This overlap is commonly referred to as high/low cross point (depending on whether PMOS or NMOS switches are used), make-before-break operation, etc. The concept of the two switches being on at the same time may be referenced as an on-state overlap time The prior art introduces long signal path for the timing critical events, that is the signal path from global clock to switch gates of the DAC cell. The on-state overlap generation is subject to timing skew and as two signal paths are used to propagate four events, the required power and area will grow exponentially with the target performance.

From the above, it is understood that there is room for improvements.

SUMMARY

An object of the present disclosure is to provide a new type of DAC design techniques which are improved over prior art and which address at least some of the drawbacks discussed above. More specifically, an object of the disclosure is to provide a new low timing uncertainty and low timing skew switch driver circuit for current steering DACs. These objects are achieved by the technique set forth in the appended independent claims with preferred embodiments defined in the dependent claims related thereto.

In a first aspect, a single ended driver circuit for a digital to analog conversion, DAC, cell is presented. The single ended driver circuit comprises one positive single-edge latch configured to provide a positive edge latched data signal by latching a positive edge of a data signal synchronized by a first clock signal, and a negative single-edge latch configured to provide a negative edge latched data signal by latching a negative edge of the data signal synchronized by a second clock signal. The positive edge latched data signal and the negative edge latched data signal are combined to provide a drive signal having a positive edge synchronized by the first clock signal and a negative edge synchronized by the second clock signal.

In one variant, the second clock signal is inverted in relation to the first clock signal. This is beneficial as it provides the possibility to fine-tune a delay between clock signals.

In one variant, the second clock signal is delayed by a delay period in relation to the first clock signal. This is beneficial as it allows an overlap time of the drive signal to be controlled by the delay period.

In a second aspect, a positive single-edge latch for providing a positive edge latched data signal of a data signal is presented. The latch comprises a high side drive transistor controlled by an output signal provided between a first high side transistor switch and a series connection of a first low side transistor switch and a second low side transistor switch. The first high side transistor switch and the second low side transistor switch are configured to be controlled by the data signal. The first low side transistor switch is configured to be controlled by a first clock signal.

In one variant, the first high side transistor switch is configured to be activated by a low state of the data signal, the second low side transistor switch is configured to be activated by a high state of the data signal, and the first low side transistor switch is configured to be activated by a high state of the first clock signal.

In one variant, the high side drive transistor is arranged to provide the positive edge latched data signal at an open drain terminal of the high side drive transistor. This is beneficial as it provides a high drive strength and reduces the need for additional drive circuitry.

In one variant, the first low side transistor switch is arranged upstream of the second low side transistor switch.

In one variant, it further comprises a second high side transistor switch operatively connected in parallel with the first high side transistor and the first low side transistor switch. The second high side transistor switch is configured to be controlled by the data signal. This is beneficial as it reduces the amplitude of glitches at the output of the positive single-edge latch.

In one variant, it further comprises an active delay circuit configured to inject a delayed portion of the output signal of the first high side transistor switch to the positive edge latched data signal. This is beneficial as it reduces the amplitude of glitches at the output of the positive single-edge latch.

In one variant, the active delay circuit comprises an inverter and a capacitor-connected transistor. This is beneficial as it allows the amount of charge and the timing of the charge that is provided to the positive edge latched data signal to be accurately controlled.

In one variant, the positive single-edge latch is configured to form part of the single ended driver circuit of the first aspect.

In a third aspect, a negative single-edge latch for providing a negative edge latched data signal of a data signal is presented. The latch comprises a low side drive transistor controlled by an output signal provided between a first low side transistor switch and a series connection of a first high side transistor switch and a second high side transistor switch. The first high side transistor switch and the first low side transistor switch are configured to be controlled by the data signal, and the second high side transistor switch is configured to be controlled by a second clock signal.

In one variant, the first high side transistor switch is configured to be activated by a low state of the data signal, the first low side transistor switch is configured to be activated by a high state of the data signal, and the second high side transistor switch is configured to be activated by a low state of the second clock signal.

In one variant, the low side drive transistor is arranged to provide the negative edge latched data signal at an open drain terminal of the low side drive transistor. This is beneficial as it provides a high drive strength and reduces the need for additional drive circuitry.

In variant, the first high side transistor switch is arranged upstream of the second high side transistor switch.

In variant, it further comprises a second low side transistor switch operatively connected in parallel with the second high side transistor and the first low side transistor switch. The second low side transistor switch is configured to be controlled by the data signal. This is beneficial as it reduces an amplitude of glitches at the output of the positive single-edge latch.

In variant, it further comprises an active delay circuit configured to inject a delayed portion of the output signal of the first low side transistor switch to the negative edge latched data signal. This is beneficial as it reduces an amplitude of glitches at the output of the positive single-edge latch.

In variant, the active delay circuit comprises an inverter and a capacitor-connected transistor. This is beneficial as it allows the amount of charge and the timing of the charge that is provided to the positive edge latched data signal to be accurately controlled.

In variant, the negative single-edge latch is configured to form part of the single ended driver circuit of the first aspect.

In a fourth aspect, a differential driver circuit is presented. The differential driver circuit comprises a first positive single-edge latch according to the second aspect and a first negative single-edge latch according to the third aspect. The positive edge latched data signal of the first positive single-edge latch is connected to the negative edge latched data signal of the first negative single-edge latch to provide a positive drive signal. The differential driver circuit further comprises a second positive single-edge latch according to the second aspect and a second negative single-edge latch according to the third aspect. The positive edge latched data signal of the second positive single-edge latch is connected to the negative edge latched data signal of the second negative single-edge latch to provide a negative drive signal. The data signal provided to the second positive single-edge latch and the second negative single-edge latch is an inverse of the data signal provided to the second positive single-edge latch and the second negative single-edge latch.

In one variant, wherein the second clock signal is inverted in relation to the first clock signal. This is beneficial as it provides the possibility to fine-tune a delay between the clock signals.

In one variant, the second clock signal is delayed by a delay period in relation to the first clock signal. This is beneficial as it allows an overlap time of the drive signal to be controlled by the delay period.

In one variant, the delay period is a configurable delay period. This is beneficial as it allows the overlap to be tuned based on performance requirement or based on feedback provided by the DAC or DAC cell.

In a fifth aspect, a digital to analog converter comprising one or more DAC-cells is presented. At least one DAC-cell is controlled by a differential driver circuit of the fourth aspect.

In one variant, the digital to analog converter further comprises a clock distribution circuit configured to, based on a received main clock signal, provide the first clock signal and the second clock signal. This is beneficial as the clock generation is comprised in one DAC such that it can be fully integrated and controlled without requirements on additional external routing.

In a sixth aspect, an integrated circuit comprising a digital to analog converter according to the fifth aspect is presented.

In a seventh aspect, a network node comprising a digital to analog converter according to the fifth aspect is presented.

In an eighth aspect, a wireless device comprising a digital to analog converter according to the fifth aspect is presented.

BRIEF DESCRIPTION OF THE DRAWINGS

These and other aspects, features and advantages will be apparent and elucidated from the following description of various embodiments; references being made to the appended diagrammatical drawings which illustrate non-limiting examples of how the concept can be reduced into practice.

5 | 6

Figure 6:
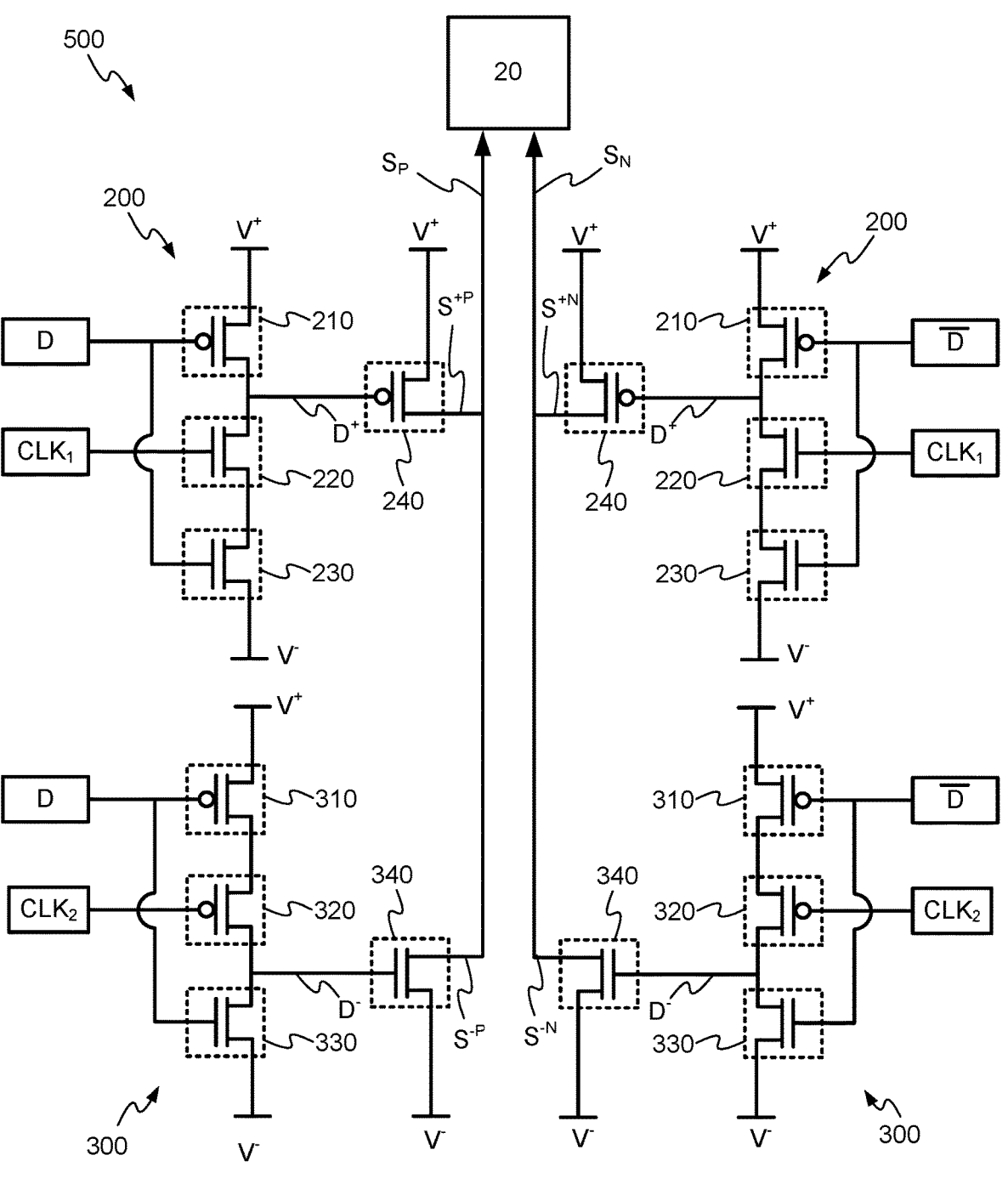
Figure 7:
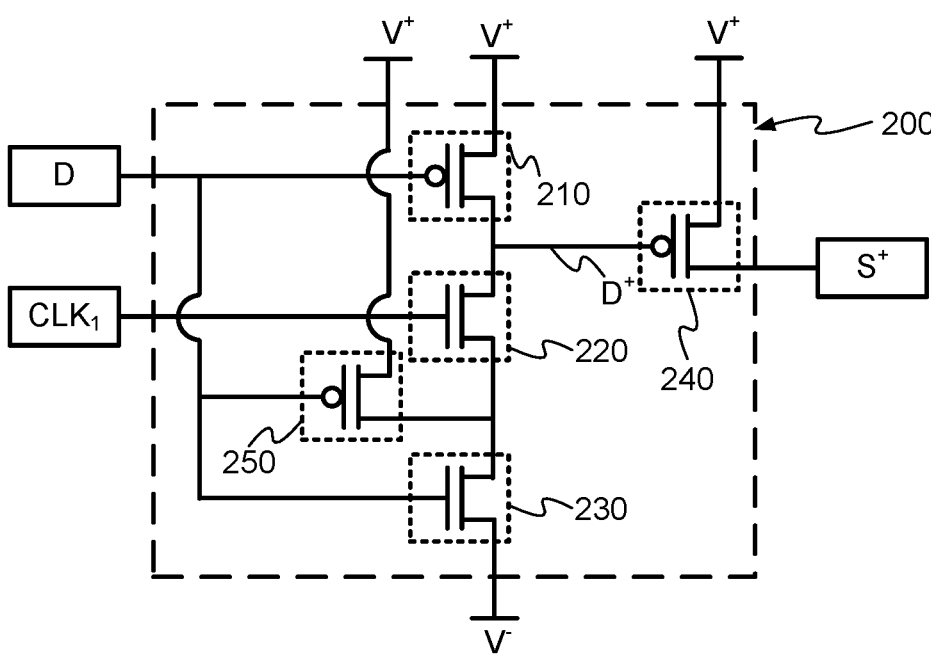
Figure 8:
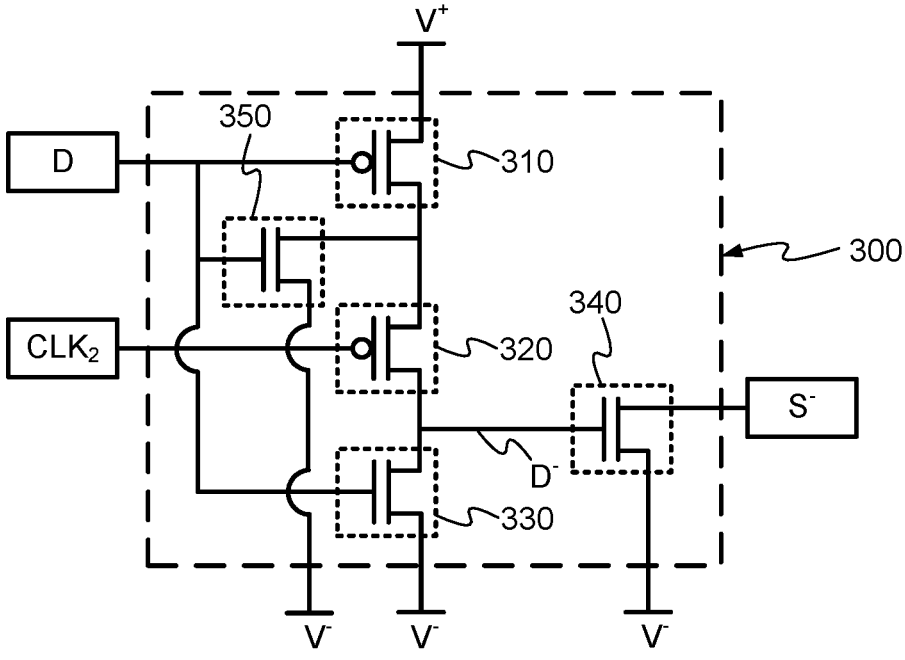
Figure 9A:
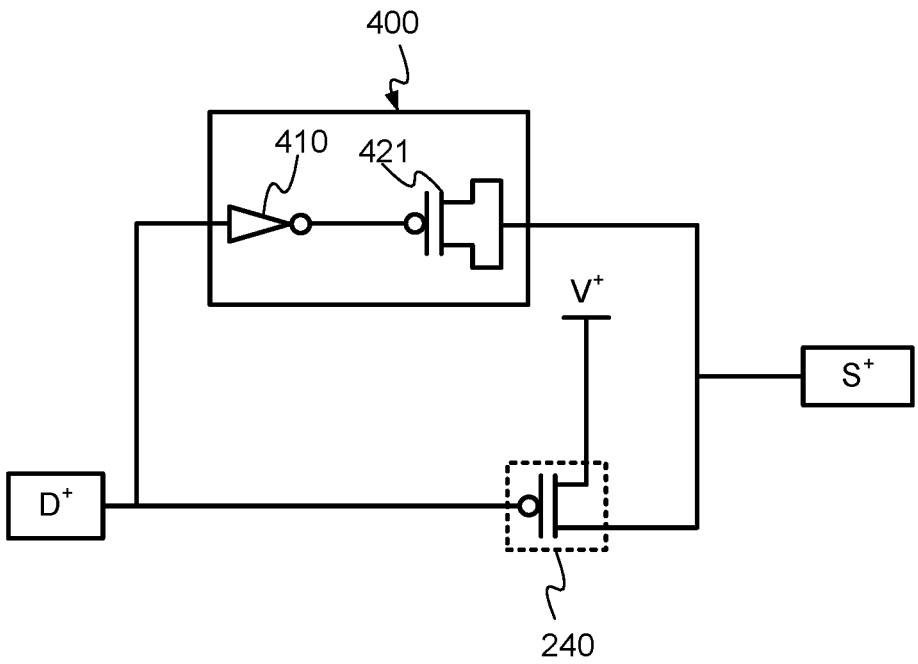
Figure 9B:
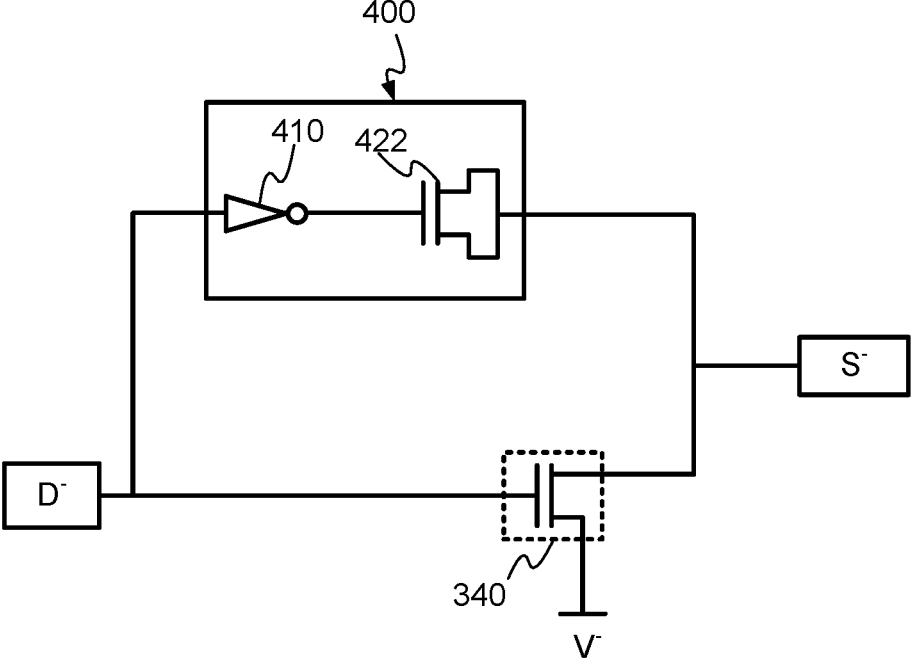
Figure 10A:
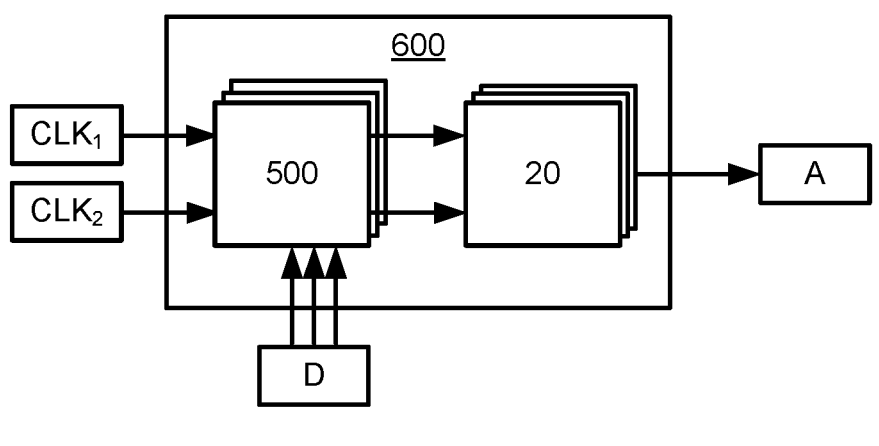
Figures 11, 12, 13:
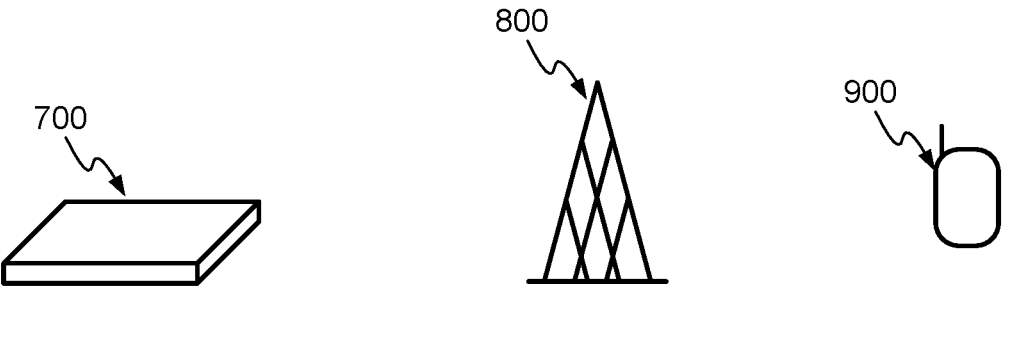

FIG. 6 is a schematic of a differential driver circuit according to some embodiments of the present disclosure;

FIG. 7 is a simplified schematic of a positive single edge latch according to some embodiments of the present disclosure;

FIG. 8 is a simplified schematic of a negative single edge latch according to some embodiments of the present disclosure;

FIG. 9*a* is a partial schematic view of a simplified schematic of a positive single edge latch according to some embodiments of the present disclosure;

FIG. 9*b* is a partial schematic view of a simplified schematic of a negative single edge latch according to some embodiments of the present disclosure;

FIGS. 10*a* and *b* are block diagrams of digital to analog converter according to some embodiments of the present disclosure;

FIG. 11 is a perspective view of an integrated circuit according to some embodiments of the present disclosure;

FIG. 12 is a view of a network node according to some embodiments of the present disclosure; and FIG. 13 is a view of a wireless device according to some embodiments of the present disclosure.

DETAILED DESCRIPTION

Hereinafter, certain embodiments will be described more fully with reference to the accompanying drawings. The disclosure should not be construed as limited to the embodiments set forth herein; rather, these embodiments are provided by way of example so that this disclosure will be thorough and complete, and will fully convey the scope defined in the appended claims, to those skilled in the art.

The term "coupled" is defined as connected, although not necessarily directly, and not necessarily mechanically. Two or more items that are "coupled" may be integral with each other. The terms "a" and "an" are defined as one or more unless this disclosure explicitly requires otherwise. The terms "substantially," "approximately," and "about" are defined as largely, but not necessarily wholly what is specified, as understood by a person of ordinary skill in the art. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method that "comprises," "has," "includes" or "contains" one or more steps possesses those one or more steps, but is not limited to possessing only those one or more steps.

With increased speeds in digital communication techniques, there is a clear trend to use ever higher communications bandwidth. In wireless communication, digital data is communicated across an analog wireless interface and the high bandwidth digital data needs to be converted to analog signals. Following the evolution of wireless communication standards such as 5G and beyond, stringent requirements are placed on the digital-to-analog converters (DACs) used in transmitting as they need to maintain high linearity, high signal to noise ratio (SNR), low levels of spurs, and other emission contributions in the output signal spectrum. Sampling rates reaching 10's of GHz may be needed in order to provide the required high bandwidth baseband transmitter signals. There are envisioned implementations where the DACs provide the RF signal directly, bypassing the up-conversion in the analog domain altogether. Such high capability DACs are anything but trivial to design and comes with extremely tight requirements on every sub-block of the DAC. This present disclosure concerns DAC design techniques addressing at least some of these tight requirements; specifically, a low timing uncertainty switch driver for current steering DACs.

Figure 1A:
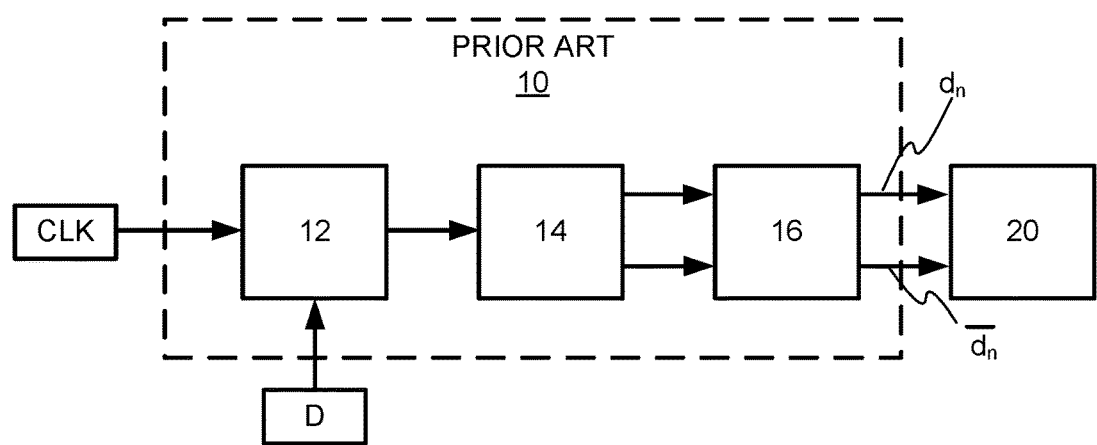
FIG. 1a is a block diagram of a prior art drive circuit for a current steering DAC cell.
Figure 1B:
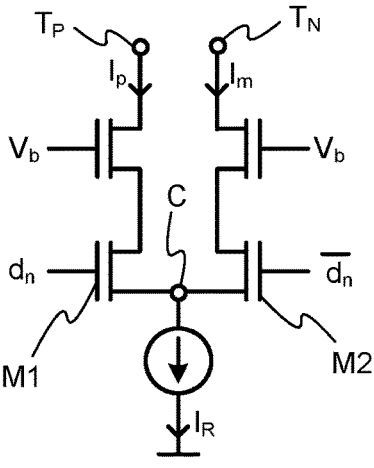
FIG. 1b is a schematic of a DAC cell.

With reference to FIG. 1*a*, a prior art drive circuit for a current steering DAC cell 20 as the one illustrated in FIG. 1*b* will be presented. As is known to the skilled person, a DAC is generally comprised of a plurality of local data-path cells 10, (only one shown in FIG. 1). A current steering DAC generally comprises a plurality of DAC cells 20, each having an associated weight $w_n$, $w_{n+1}$, $w_{n+2}$, ... $w_{n+m}$. The local data-path cells 10 are each connected to a DAC cell 20 whose one or more outputs are connected together to produce a composite output current delivered to a load. Each local data-path cell 10 is driven by a binary signal $d_n$, $d_{n+1}$, $d_{n+2}$, ..., $d_{n+m}$ comprised in a set of binary signals D, or data signal D. The drivers 10 receive the binary signal $d_n$ either directly as bits from a digital waveform sample sequence or via an encoder depending on the required mapping from signal domain to control of individual DAC cells 20. Each binary signal $d_n \epsilon \{-1,1\}$ is weighted by a weight $w_n$ associated with the local data-path cell 10. The local data-path cell 10, or their corresponding functionality, is sometimes referred to as DAC-cell switch control cells, DAC-cell switch driver cells or drivers.

As previously mentioned, inputs of the DAC cells 20 are updated in synchrony, usually to a reference clock signal, CLK, such that the DAC cells 20 are only ever configured to output analog levels corresponding to the set of binary signals D. This is known as glitch-free operation. A delay through any given logic circuitry is dependent on a combination of circuit parameters, e.g. device size, threshold voltages, driving strength, output load and self-load, input slew rate etc. The dependence on input slew rate means that the delay through a given gate is determined not only on its intrinsic parameters, but also, on how its inputs are driven. Therefore, since the circuit parameters vary randomly for each physical driver instance, in order to reduce the delay variation of otherwise identical chains of CMOS gates, it is preferable to reduce both the number of devices involved as well as the number of intermediate nodes along the clock path and the synchronized data path. In other words, the number of nodes that have to transition each time clock and/or data changes states are preferably reduced. Spread in delay between DAC cells 20 will introduce glitches when the binary signal is updated, i.e. changes state. It is generally known that, in order to maintain an operating point of a reference current generator used to drive a DAC cell 20, and therefore, the linearity of a DAC, it is beneficial to maintain a conduction path for the reference current at all times.

In FIG. 1*b*, the basic structure of a DAC cell 20 for the current-steering driver 10 is shown. It is well understood that, for high performance, the output should be differential, therefore a pair of switches, M1 and M2, are used to redirect a reference current $I_R$ to either a positive $T_P$ or a negative terminal $T_N$ of the differential output. Typically, the reference current $I_R$ represents the bit-weight of the particular DAC cell 20. It is commonly understood that, in order to maintain the operating point of the reference current generator and the reference current $I_R$, and therefore, the linearity of the DAC, it is beneficial to maintain a conduction path for the reference current at all times. That is, the impedance seen at the switch common node (node C in FIG. 1*b*) should remain as fixed as possible. A commonly used technique to achieve this is to close both switches M1, M2 simultaneously for a brief moment when the binary signal $d_n$ to a DAC cell 20 changes. It is, therefore, the task of the switch drivers 10 to ensure that the switch control signals, i.e. the binary signals $d_n$, overlap in time during their on-state. This overlap is, as mentioned, commonly referred to as high/low cross point (depending on whether PMOS or NMOS switches are used), make-before-break operation, etc. The concept of the two switches being on at the same time may, in this disclosure, be referred to as on-state overlap time.

Returning to the block diagram of FIG. 1a, there are numerous published circuits implementing the functionality for driving the switches of a current-steering DAC cell 20. Common to the prior art is that their operation and components can all be mapped to the block diagram shown in FIG. 1a. The operation of the driver 10 starts with a latch element 12 which propagates the bit data D in synchrony with a global reference clock CLK. An output signal of the latch 12 contains the bit data D mixed with the reference clock CLK into one signal. This means that the single output of the latch 12 carries both timing and state information.

In an on-state overlap time generation block 14, the mixed clock and data signal is split in two differential signals (with complementary data). Importantly, however, the edges of these differential signals are intentionally skewed with respect to each other. An edge that will turn on one of the switches M1, M2 in the DAC cell 20 is propagated with a sufficiently short delay. An edge that will turn the other one of the switches M1, M2 off is intentionally delayed more than the edge turning on said one of the switches M1, M2. This ensures that the DAC cell switches M1, M2 are briefly turned on at the same time and that there is a reduced risk of abrupt changes in the impedance of node C as would have been the case if both switches M1, M2 were off at the same time. By delaying a turning off of a switch M1, M2, there will always be a path for the reference current $I_R$. The resulting signals from the on-state overlap time generation block 14 are provided to a buffer 16. The output of the buffer 16 are the binary signals $d_n$, $\overline{d_n}$ used to drive the switches M1 and M2 of FIG. 1b.

In the solutions of FIGS. 1a and 1b, all blocks comprising switch drivers 10, apart from the clock generation and distribution, are local to each DAC cell 20. In other words, after the global reference clock CLK, no devices or signals are shared between paths for the binary signals $d_n$, $d_{n+1}$, $d_{n+2}$, . . . , $d_{n+m}$. In addition to this, the data is latched very early in the timing chain—already by the latch element 12.

As is clear to a person skilled in the art, after being given the time to fully digest the teachings of this disclosure, in a particular transistor implementation of a switch driver, not all blocks in FIG. 1a will be easy, or even possible, to cleanly separate and to assign devices to the function of one block only. For example, it is common that the data latching 12 and differential signal generation with on-state overlap 14 is done simultaneously, or that no additional buffer 16 is used. Regardless of this, the circuits remain local to the DAC cells 20, and the order of operations remains the same, i.e. clock and data are latched early in the chain, before generation of on-state overlap and before any differential signal generation.

In summary, all signals downstream of the latch 12 contain timing information on both their rising and falling edges. That is, there are no separate paths carrying the timing information for the turn on and turn off events of a given switch M1, M2. Instead, the events are propagated through the same nodes by the same signals. Notice that this is not the same between the two switches M1, M2. A signal path for one switch M1 will have to be different from a signal path of the other switch M2, at least the path from the differential signal generation with on-state overlap 14 and onwards to the switches M1, M2. It should be noted that, the differential signal generation with on-state overlap 14 is a quite complex circuit with many devices, nodes and comparably long signal paths.

Just like in digital circuits, one reason for the occurrence of glitches in analog circuits may be due to a signal path fanning out to separate paths and later in the signal chain, fans back in to one signal again. The separate paths of the signal are generally subjected to different circuitry, routing lengths etc. causing a delay that is inconsistent for the signal paths. This is what happens with the reference clock CLK in a DAC—it is mixed with the data to produce the driving signals for each DAC cell (fan-out), propagates through driver buffers and the DAC cells, finally the outputs of the DAC cells 20 are summed to generate the output signal (fan-in). This path, from the common clock to the DAC output is referred here as timing path.

In order to guarantee glitch-free operation, all blocks between the clock fan-out and an output summation node connecting the different DAC cells 20 preferably present identical propagation delays, regardless of bit weight, data history, analog output state, and random fluctuations of the, otherwise identical, device properties comprising each individual path. In practice, however, several factors contribute to different propagation delays for each individual branch. This timing mismatch is referred to as timing skew. A characteristic of the timing skew is that it is static for a given signal, operating conditions, and circuit sample. That is, it depends on process, voltage, temperature, corner, signal history, and device matching. The latter, matching, means that the delay distribution between the timing paths in a DAC are statistical in nature. However, since it does not depend directly on time, it is different from timing jitter which is understood as being random in time. Timing skew generates distortion at the output while timing jitter generates noise.

Glitches at the DAC output represent signals which are not originally present in the input data sequence. However, they are strongly dependent on the specific transitions of the input data. Therefore, the linearity performance of the DAC heavily depends on ensuring very low power levels of the glitch signals and, by extension, on accurate timing path matching, i.e. low timing skew.

One challenge of the solution presented in FIG. 1a is related to achieving low timing skew between the DAC cells 20 while maintaining low-power operation and small chip area. The challenge stems from the functional requirement to simultaneously latch the data and drive the DAC cell switches M1, M2 with overlapping signals. These are two related in time, but functionally separate timing features.

As mentioned, the complex circuitry of the on-state overlap generation 14 results in long signal paths for the timing critical events. Since only one edge of a switch control signal $d_n$, $\overline{d_n}$ (the one turning it off) has to be delayed, it is gated by a delayed version of the other ("turn on") edge. This gating introduces at least one extra stage as well as at least one extra node in the signal chain and requires extra devices to be connected to the other signal nodes. This is the functionality of the on-state overlap time block 14 in FIG. 1a. As was already established, the timing skew performance deteriorates as more devices and nodes are added in the timing signal path. Therefore, the long timing path created by the gating of the "turn off" edge is detrimental to the timing skew performance, and hence to, linearity and overall power consumption as well.

The on-state overlap time is added after mixing clock and data (after latching 12). Therefore, on-state overlap generation must be done locally to the DAC cell 20, hence, it is subject to timing skew. This may be viewed from another point of view regarding the order of operations in FIG. 1a. The generation of on-state overlap time is an inherently complex operation as it has to involve the clock together with a current and a next data state. In the prior art, on-state overlap generation is placed in the critical timing path, that is after data is latched, this limits the ultimate performance of the driver.

Additionally, in differential implementations, two signal paths are used to propagate four events, requiring the power and area to grow exponentially with the target performance. This is related to a maximum speed of the logic transitions at internal nodes of the driver 10 and the DAC cell 20. As was previously mentioned, in order to achieve low timing skew, it is important to maintain fast signal transitions between logic levels. For a given load at the output of a logic gate, the only way to speed up a transition in a given direction is to increase the driving strength (size up) the corresponding pull-up/down network. However, this has the added effect that the total output load is increased and the transition speed in the opposite direction is reduced, requiring even further upsizing. This leads to a recursive cycle of transistor up scaling. From the description of FIGS. 1a and 1b, since both logic transitions for substantially all nodes after the latch 12 carry timing information, the required power and area grows exponentially with the targeted performance.

Further to this, the input of the DAC cell 20, i.e. the latch 12 takes two control signals for its two switches M1, M2, and both the rising and the falling edge of these control signals are timing critical. The solutions presented in FIGS. 1a and 1b, employ two paths to propagate the information for the control signals $d_n$, $\overline{d_n}$ of the two switches M1, M2. In other words, they propagate the "turn on" as well as the "turn off" events on the same path—four events for two switches M1, M2 propagated on two paths. Therefore, the area and power required for a given performance will grow exponentially.

The present disclosure presents a new architecture for the switch driver of an IDAC unit cell, i.e. a current steering DAC cell, and timing path based on a new latching element that is synchronizing (to the clock) and propagating, to its output, only one logic transition—rising or falling. This latch enables the rearranging of the operations in the local data-path cell 10 of FIG. 1a and present a different architecture. This new latch is configured to synchronize only one of the input data logic transitions to the edges of the clock. Further to this, the latch allows the use of four separate timing critical paths—one per critical timing event, where each path may be optimized for one transition direction only. The change in architecture of the switch driver makes it possible to move the on-state overlap time generation before the data latching operation is performed, thus reducing the length and complexity of the timing critical paths. In addition to this, the on-state overlap time is generated globally for all DAC cells 20. This eliminates its timing skew contribution when compared to local on-state overlap time generation. Furthermore, it allows the on-state-overlap time to be trimmed globally for the entire DAC.

It should be mentioned that although the present disclosure focuses on on-state overlap, there may very well be embodiment wherein an off-state overlap is desired and the solutions presented herein are just as applicable for applications in need of a controlled off-state overlap.

Figure 2:
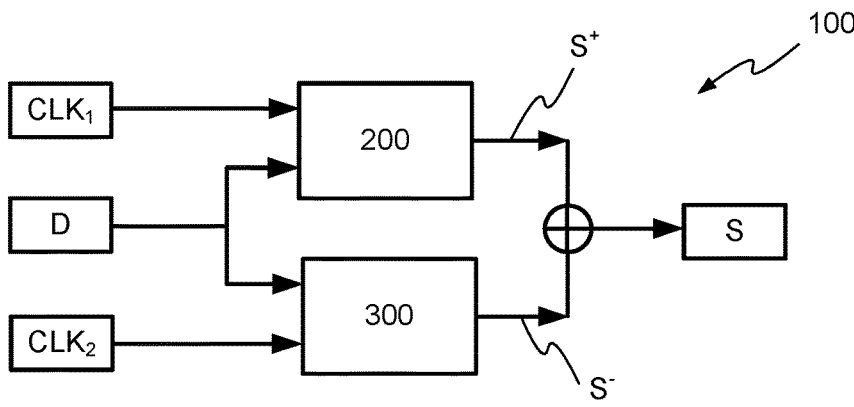
FIG. 2 is a single ended driver circuit according to some embodiments of the present disclosure.

The functional description of the latch will be explained in the following starting with the schematic block diagram of FIG. 2. FIG. 2 illustrates one embodiment of a single ended driver circuit 100. The driver circuit 100 is suitable for providing control signal $d_n$, $\overline{d_n}$ to the DAC cell 20. The driver circuit 100 comprises one positive single-edge latch 200 and one negative single-edge latch 300. The positive single-edge latch 200 is configured to provide a positive edge latched data signal $S^+$ by latching a positive edge of a data signal D synchronized by a first clock signal $CLK_1$. That is, the positive edge latched data signal $S^+$ is only actively driven when the data signal D is high and the first clock signal $CLK_1$ is high, i.e. only the rising edge of the data signal D is synchronized and propagated to the positive edge latched data signal $S^+$. Similarly, the negative single-edge latch 300 is configured to provide a negative edge latched data signal $S^-$ by latching a negative edge of the data signal D synchronized by a second clock signal $CLK_2$. That is, the negative edge latched data signal $S^-$ is only actively driven when the data signal D is low and the second clock signal $CLK_2$ is low. The outputs of the positive single-edge latch 200 and the negative single-edge latch 300, i.e. the positive edge latched data signal $S^+$ and the negative edge latched data signal $S^-$, are combined to provide a drive signal S. The drive signal S may be fed through a buffer circuitry to provide the control signal $d_n$, $d_n$ to the DAC cell 20 or fed directly to DAC cell 20 depending on e.g. design constraints. The drive signal S will have a positive edge synchronized by the first clock signal $CLK_1$ and a negative edge synchronized by the second clock signal $CLK_2$.

The single ended driver circuit 100 enables the control of latching of a positive edge of the data signal D independently of the latching of the negative edge of the data signal D. The on-state overlap, or off-state overlap for that matter, is controlled by a phase difference, or a delay, between the first clock signal $CLK_1$ and the second clock signal $CLK_2$. One of the clock signals $CLK_1$, $CLK_2$ may be delayed with regards to the other clock signal $CLK_1$, $CLK_2$ by a delay period $T_D$, see FIG. 5. This delay period $T_D$ may, in some embodiments, be controlled through one or more software controllable registers. The control, or tenability, of the delay period $T_D$ allows for a more aggressive and finely tuned design. That is to say, the delay period $T_D$ may be easily tuned and optimized, per unit, batch, series, product and/or platform in order to allow efficient and fast DAC operation.

As the delay period $T_D$ may be generated globally and shared between some or all DAC cells 20, it is possible to feedback an output performance of a DAC 600 (see FIGS. 10a-b) and tune the delay period $T_D$, and thereby the on-state overlap time to optimize DAC performance.

In the following, it is assumed that the DAC cell 20 and any other circuitry is implemented such that switches turn on when the voltage level at their control port, i.e. their gate, is high. In other words, the embodiments presented are given with transistors of NMOS type. Anyone skilled in the art appreciates that all circuits presented herein may be transformed to their dual, and all reasoning will be the same for the case when circuitries are provided with switches of PMOS type.

Figures 3, 4:
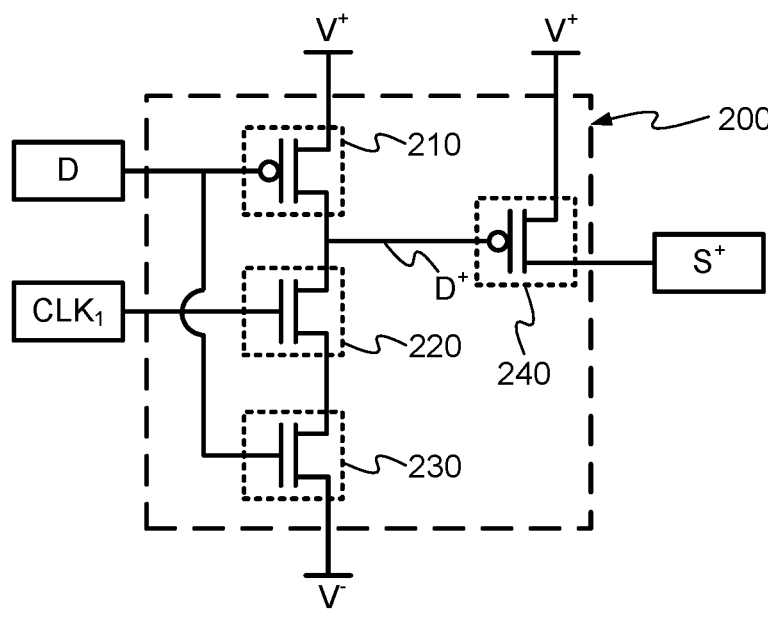
FIG. 3 is a simplified schematic of a positive single edge latch according to some embodiments of the present disclosure.
FIG. 4 is a simplified schematic of a negative single edge latch according to some embodiments of the present disclosure.

With reference to FIG. 3, the inner workings of the positive single-edge latch 200 according to one embodiment will be given. The positive single-edge latch 200 is, as previously stated, configured to provide the positive edge latched data signal $S^+$ of the data signal D. The positive single-edge latch 200 comprises a high side drive transistor 240, a first high side transistor switch 210, a first low side transistor switch 220 and a second low side transistor switch 230. The first high side transistor 210, the first low side transistor switch 220 and the second low side transistor switch 230 are connected in series between negative feed $V^-$ and a positive feed $V^+$. The series connection is such that the low side transistor switches 220, 230 are arranged downstream from the first high side transistor switch 210. The first high side transistor switch 210 and the second low side transistor switch 230 are configured to be controlled by the data signal D and the first low side transistor switch 220 is configured to be controlled by the first clock signal $CLK_1$. The high side drive transistor 240 is controlled by an output signal $D^+$ provided between the first high side transistor switch 210 and the series connection of the low side transistor switches 220, 230. The high side drive transistor 240 is preferably configured to provide the positive edge latched data signal $S^+$ at an open drain of the high side drive transistor 240.

In the positive single-edge latch 200 of FIG. 3, when the data signal D is low, the output signal $D^+$ between the first high side transistor switch 210 and the series connection of the low side transistor switches 220, 230 will always be high regardless of the state of the first clock signal $CLK_1$. In other words, as soon as the data signal D goes low, the output signal $D^+$ will go high and stay high at least for the duration of the data signal D being low. When the data signal D is high, the output signal $D^+$ will depend on the state of the first clock signal $CLK_1$. If the data signal D goes high at a point in time when first clock signal $CLK_1$ is also high, the output signal $D^+$ will be driven low by the series connection of the low side transistor switches 220, 230. However, if the first clock signal $CLK_1$ is low when the data signal D goes high, the output signal $D^+$ will remain at a high state subject to e.g. gate source leakage currents of the high side drive transistor 240. However, when the first clock signal $CLK_1$ changes to a high state, the output signal $D^+$ will be driven low and the gate of the high side drive transistor 240 will be discharged. As the positive edge latched data signal $S^+$ is provided at an open drain of the high side drive transistor 240, it will be the inverse of the output signal $D^+$ and, the positive single-edge latch 200 of FIG. 3 will, in this embodiment, only be able to drive the positive edge latched data signal $S^+$ high and this will be in response to the data signal D and the first clock signal $CLK_1$ being high at the same time.

In FIG. 4, a negative single-edge latch 300 according to one embodiment is illustrated. The working of the negative single-edge latch 300 are similar to those of the positive single-edge latch 200 of FIG. 3, but the negative single-edge latch 300 is configured to provide the negative edge latched data signal $S^-$ of the data signal D. The negative single-edge latch 300 comprises a low side drive transistor 340, a first high side transistor switch 310, a second high side transistor switch 320 and a first low side transistor switch 330. The first high side transistor 310, the second high side transistor switch 320 and the first low side transistor switch 330 are connected in series between negative feed $V^-$ and a positive feed $V^+$. The series connection is such that the high side transistor switches 310, 320 are arranged upstream from the first low side transistor switch 330. The first high side transistor switch 310 and the first low side transistor switch 330 are configured to be controlled by the data signal D and the second high side transistor switch 320 is configured to be controlled by the second clock signal $CLK_2$. The low side drive transistor 340 is controlled by an output signal $D^-$ provided between the series connection of the high side transistor switches 310, 320 and the first low side transistor switch 330. The low side drive transistor 340 is preferably configured to provide the positive edge latched data signal $S^+$ at an open drain of the low side drive transistor 340.

In the negative single-edge latch 300 of FIG. 4, when the data signal D is high, the output signal $D^-$ between the first low side transistor switch 330 and the series connection of the high side transistor switches 310, 320 will always be low regardless of the state of the second clock signal $CLK_2$. In other words, as soon as the data signal D goes high, the output signal $D^-$ will go low and stay low at least for the duration of the data signal D being high. When the data signal D is low, the output signal $D^-$ will depend on the state of the second clock signal $CLK_2$. If the data signal D goes low at a point in time when second clock signal $CLK_2$ is also low, the output signal $D^-$ will be driven high by the series connection of the high side transistor switches 310, 320. However, if the second clock signal $CLK_2$ is high when the data signal D goes low, the output signal $D^-$ will remain at a low state. However, when the second clock signal $CLK_2$ changes to a low state, the output signal $D^-$ will be driven high and the gate of the low side drive transistor 340 will be charged. As the negative edge latched data signal $S^-$ is provided at an open drain of the low side drive transistor 340, it will be the inverse of the output signal $D^-$ and the negative single-edge latch 300 of FIG. 4 will only be able to drive the negative edge latched data signal $S^-$ low and this will be in response to the data signal D and the second clock signal $CLK_2$ being low at the same time.

The connection of the transistor switches 210, 220, 230 of the positive single-edge latch 200 of FIG. 3 is illustrated with the first low side transistor switch 220 sandwiched between the second low side transistor switch 230 and the first high side transistor switch 210. Similarly, the connection of the transistor switches 310, 320, 330 of the negative single-edge latch 300 of FIG. 4 is illustrated with the second high side transistor switch 320 sandwiched between the first low side transistor switch 330 and the first high side transistor switch 310. This means that the output signals $D^-$, $D^+$ are connected to the transistor switch 220, 320 being controlled by the clock signal $CLK_1$, $CLK_2$. Compared to an opposite arrangement (not shown), wherein the first low side transistor switch 220 and the second low side transistor switch or the first high side transistor switch 310 and the second high side transistor switch 320 change positions, a coupling from the data signal D to the positive respective negative edge latched data signal $S^+$, $S^-$ is reduced. But it should be emphasized that embodiments of the present disclosure are applicable regardless of the order of the first low side transistor switch 220 and the second low side transistor switch 230 or the first high side transistor switch 310 and the second high side transistor switch 320.

From the description given of the positive single-edge latch 200 and the negative single-edge latch 300 it is clear that the positive single-edge latch 200 is configured to provide the positive edge latched data signal $S^-$ synchronized to the first clock $CLK_1$, and the negative single-edge latch 300 is configured to provide the negative edge latched data signal $S^-$ synchronized with the second clock $CLK_2$. As was illustrated in FIG. 2, the positive edge latched data signal $S^+$ is combined with the negative edge latched data signal $S^-$. Because both latched data signals $S^+$, $S^-$ are provided at an open drain, the signals $S^+$, $S^-$ may be connected directly to one another in order to provide the drive signal S. As the positive single-edge latch 200 is latched when the first clock signal $CLK_1$ goes high and the negative single-edge latch 300 is latched when the second clock signal $CLK_2$ goes low, the second clock signal $CLK_2$ is preferably an inverse of the first clock signal $CLK_1$ with the addition of the delay period $T_D$. The frequencies of the first clock signal $CLK_1$ and the second clock signal $CLK_2$ are preferably substantially equal.

Figure 5:
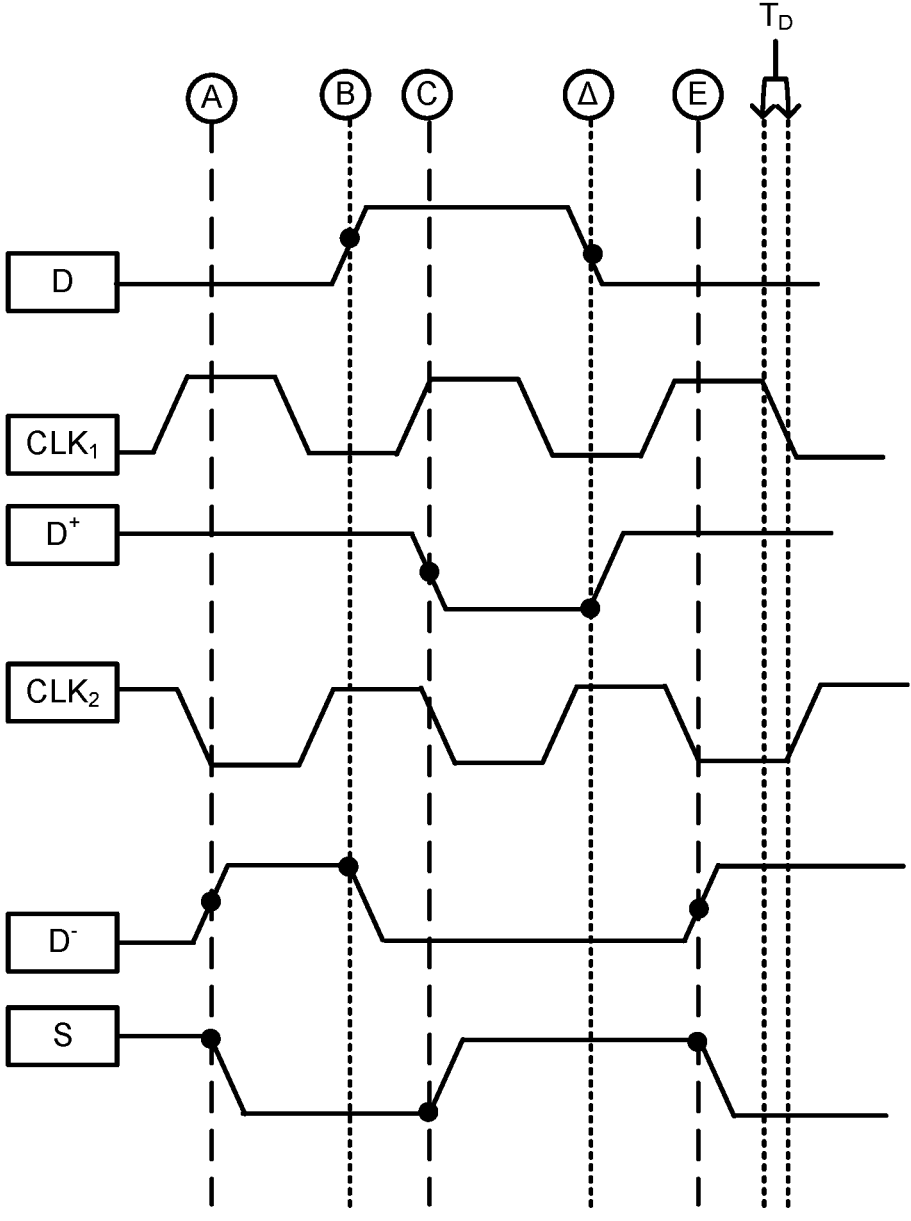
FIG. 5 is a timing diagram of signals provided by driver circuits according to some embodiments of the present disclosure.

FIG. 5 illustrates a timing diagram of the signals of the single ended driver circuit 100 as depicted in FIG. 2. The timing diagram illustrates the data signal S, the first clock signal CLK1, the second clock signal CLK2, the drive signal S and the output signals $D^+$, $D^-$ controlling the drive transistors 240, 340 of the single-edge latches 200, 300. These signals are all presented on a common time-based x-axis. In FIG. 5, the second clock signal $CLK_2$ is inverted with regards to the first clock signal $CLK_1$ and delayed by the delay period $T_D$. It is preferable to keep the data signal D stable when the first clock signal $CLK_1$ is high in order to synchronize the drive signal S to the first clock signal $CLK_1$. In the timing scenario of FIG. 5b, the drive signal S rising edge is synchronized to the first clock signal $CLK_1$, and its falling edge is synchronized to the second clock signal $CLK_2$ At the start of the timing diagram, the data signal D is low and the output signal $D^+$ of the positive single-edge latch 200 is actively driven high. In this state, the output signal $D^+$ of the positive single-edge latch 200 will remain high regardless of the state of the first clock signal $CLK_1$. Consequently, the positive edge latched data signal $S^+$ will be open, that is high impedance. The positive edge latched data signal $S^+$ will stay in its high impedance state at least as long as the data signal D is low. However, the second clock signal $CLK_2$ is high which implies that the output signal $D^-$ of the negative single-edge latch 300 is floating at a high state (due to a historic previous state not shown where the second clock signal $CLK_2$ was low and the gate of the low side drive transistor 340 was charged). This means that the output signal $D^-$ of the negative single-edge latch 300 is actively driven high and the drive signal S is driven to a low state by the low side drive transistor 340 of the negative single-edge latch 300.

At a first point in time A, the drive signal S is driven low in response to the output signal $D^-$ of the negative single-edge latch 300 going high. Which happens at a same time, ignoring delay between switches, as the second clock signal $CLK_2$ going low when the data signal D is low. At a second point in time B, the data signal D goes high, but this transmission is not reflected in the drive signal S until the first clock signal $CLK_1$ goes high causing the output signal $D^+$ of the positive single-edge latch 200 to go low, see a third point in time C. At a fourth point in time A, the data signal D goes low which causes the output signal $D^+$ of the positive single-edge latch 200 to go high asynchronously with respect to any of the clock signals $CLK_1$, $CLK_2$. But the change in data signal D at the fourth point in time A is not propagated to the drive signal S until the output signal $D^-$ of the negative single-edge latch 300 goes high at fifth point in time E. The output signal $D^-$ of the negative single-edge latch 300 goes high responsive to the second clock signal $CLK_2$ going high when the data signal D is low. That is, at time instant E the output signal $D^-$, and the drive signal S are synchronized to the second clock signal $CLK_2$.

As seen in the embodiment of FIG. 5 the positive edge of the data signal D is transitioned to the drive signal S synchronized to the first clock signal $CLK_1$, and the negative edge of the data signal D is transitioned to the drive signal S synchronized to the second clock signal $CLK_2$. As understood from the description given, the drive signal S may be described as a PWM signal having a duty cycle that is controllable by the delay period $T_D$. If the delay period $T_D$ is zero, the duty cycle would be 50% and if the delay period $T_D$ is half a period time of the clock signals $CLK_1$, $CLK_2$, the duty cycle would be 75% and so on.

As the delay period $T_D$, and thereby the amount of on-state overlap is not limited by requirements for timing matching, complexity of the local DAC-circuits etc., as is the case of the prior art, it may be selected freely. This allows for the delay period $T_D$ to be chosen to match e.g. requirements for keeping an operation point of a DAC cell stable.

The configuration with the drive transistors 240, 340 of the single-edge latches 200, 300 provides an inherently strong output stage that effectively eliminates a need for additional drive circuitry. Prior art solutions generally require additional circuitry, such as inverter-based buffers, to provide this in order to achieve the low timing skew that is required for high performance DACs 600. This is inherent through the drive transistors 240, 340 of the single-edge latches 200, 300 which further reduces complexity and cost compared to the prior art.

In FIG. 6, a differential driver circuit 500 is illustrated. The differential driver circuit 500 comprises a first single ended driver circuit 100 and a second single ended driver circuit 100, each according to any suitable embodiment of this disclosure. A positive drive signal $S^P$ is provided by the first single ended driver circuit 100 by connecting a positive edge latched data signal $S^{+P}$ of a first positive single-edge latch of the first single ended driver circuit 100 to a negative edge latched data signal $S^{-P}$ of a first negative single-edge latch 300 of the first single ended driver circuit 100. Similarly, a negative drive signal $S^N$ is provided by connecting a positive edge latched data signal $S^{+N}$ of a second positive single-edge latch 200 of the second single ended driver circuit 100 to a negative edge latched data signal $S^{-N}$ of a second negative single-edge latch 300 of the second single ended driver circuit 100. The data signal $\overline{D}$ provided to the second positive single-edge latch 200 and the second negative single-edge latch 300 is an inverse of the data signal D provided to the second positive single-edge latch 200 and the second negative single-edge latch 300. The drive signals $S^N$, $S^P$ are for operatively connection to a DAC cell 20.

From FIG. 6 it has been shown that the single ended driver circuit 100 of the present disclosure is usable also for forming a differential driver circuit 500. Differential circuitry are in many cases the preferred circuitry for high speed DACs 600. The differential DAC has added benefits compared to the single ended DAC as it is less sensitive to electromagnetic interference, since the differential drive signals $S^N$, $S^P$ are transmitted on balanced lines. The risk of crosstalk is reduced and perhaps even more important, it may be used for high speed transmission lines with good quality much due to the reduced noise and radiation. Consequently, common mode rejection as well as improved power supply rejection can be achieved by the differential DAC.

Returning to the general idea of the present disclosure. With the global generation of the on-state overlap and the possibility to share it with one, some or all DAC cells 20, the number of nodes in the timing critical path is greatly reduced which in turn reduces the current consumption of the circuitry as fewer gates needs to be switched. In the prior art, one clock signal is distributed to an array of switch drivers of a DAC and locally delayed to create the on-state overlap. In the present solution, two clocks $CLK_1$, $CLK_2$ are distributed to the array of switch drivers of the DAC 600. One clock controls turn on events and the other clock controls turn off events, such that, in differential operation, when these clocks are mixed with the data signal D, four separate signals are provided (four timing paths), each carrying one timing event. In addition, the delay period $T_D$ may be generated globally for all timing paths and the resulting delay period $T_D$ may be distributed similarly to a main clock. Therefore, its timing skew contribution can be significantly reduced. Furthermore, since it is outside of the sensitive timing path, the circuit can be made substantially more advanced and still allows for lower random timing jitter.

The solution of the present disclosure provides each timing event on a separate path. This gives a higher degree of freedom in designing each timing path and consequently a more fine-tuned design.

The present solutions offers a break-before-make operation which allows for higher switching speeds, lower timing skew and reduced power consumption. In the context of CMOS circuits, break-before-make comprises of setting a node to high impedance state, just before changing its logic level. Consider the positive edge latched data signal $S^{+P}$ in FIG. 6 and the timing diagram of FIG. 5. When the data signal D is a logic high, see second and third time points B, C in FIG. 5b, the low side drive transistor 340 of the first negative single-edge latch 300 of the first single ended driver circuit 100 is off, regardless of the second clock signal $CLK_2$. I.e. the negative edge latched data signal $S^{-P}$ is high impedance. The high side drive transistor 240 of the first positive single-edge latch 200 of the first single ended driver circuit 100 is turned on synchronously to the first clock signal $CLK_1$. This drives the positive edge latched data signal $S^{+P}$ and the positive drive signal $S^P$ high. When the data signal D goes low, see the fourth time point Δ in FIG. 5b, the high side drive transistor 240 of the first positive single-edge latch 200 of the first single ended driver circuit 100 is turned off, leaving the positive edge latched data signal $S^{+P}$ in a high impedance state. The negative edge latched data signal $S^{-P}$ is still at a high impedance state which means that the positive drive signal $S^P$ is floating until the second clock signal $CLK_2$ goes low. Importantly, since the positive drive signal $S^P$ is floating, no short circuit current flows through the drive transistors 240, 340 and all of the drive current, i.e. current at the output signals $D^+$, $D^-$, is available to change the output state, increasing speed and reducing power consumption.

The break-before-make operation is also utilized in earlier stages of the single ended driver circuit 100. When the first clock signal $CLK_1$ is low, the output signals $D^+$, $D^-$ are either floating or not going to transition. Similarly, when the first clock signal $CLK_1$ goes high, the data signal D is preferably stable and the output signals $D^+$, $D^-$ are either driven at their current state or are left floating, they are not going into transition.

The break-before-make operation allows the transitions to happen much faster than they could in a conventional CMOS gate. There are a few reasons for this. A first reason is that no shoot-through current flows between the supplies which result in the full driving strength of the devices being utilized to charge/discharge the driven nodes. In addition to this, the number of transistor gates connected to input nodes of break-before-make gates is typically half of that of an equivalent conventional gate, i.e. half of the load is present to the stage driving them. Additionally, since only one transition at a given input of a break-before-make gate can trigger a transition at the output, the preceding (driving) gate can be optimized to generate fast transitions only in that direction, thus avoiding effects of self-loading.

The second and third reason given above can be understood by the drive transistors 240, 340 only propagating one transition. Therefore, the resetting switches 210, 310, i.e. the switches 210, 310 controlled by the data signal D, may be made smaller speeding up the overall operation. Further to this, only one transistor gate is connected to each output signal $D^+$, $D^-$ compared to a typical push-pull configuration where the same control signal controls both a high side switch and a low side switch.

Turning to FIG. 7, one optional embodiment of the positive single-edge latch 200 is presented. This embodiment may be combined with any other embodiment of the positive single edge latch 300. In this embodiment, a second high side transistor switch 250 is operatively connected in parallel with the first high side transistor 210 and the first low side transistor switch 220 and controlled by the data signal D. The second high side transistor switch 250 will asynchronously preset the state of a node between the first and second low side transistor switches 220, 230. This reduces a risk of glitches occurring on the output signal $D^+$. Such glitches may otherwise be as a consequence of the node between the first and second low side transistor switches 220, 230 being charged by the first low side transistor switch 220 when the first clock signal goes high $CLK_1$ when the data signal D is low. This may cause a small glitch on the output signal $D^+$ which may propagate through the high side drive transistor 240 to switches of the DAC cell 20. This glitch is data dependent and may cause distortion at the DAC output. For the present disclosure and high speed applications, it is preferably to configure the first high side transistor switch 210 and the second low side transistor 230 switch as large in comparison to the first low side transistor switch 220. This configuration may produce larger glitches on the output signal $D^+$ and the benefits of the second high side transistor switch 250 are even more apparent.

In FIG. 8, an optional embodiment of the negative single edge latch 300 is presented. This embodiment may be combined with any other embodiment of the negative single edge latch 300. This negative single edge latch 300 is analogues to the positive single edge latch 200 of FIG. 7 in its configuration with a second low side transistor switch 350 operatively connected in parallel with the second high side transistor 320 and the first low side transistor switch 330 and controlled by the data signal D. As in the embodiment of the positive single edge latch 200 of FIG. 6 and for the same reasons, the second low side transistor switch 350 will asynchronously preset the state of a node between the first and second high side transistor switches 310, 320.

In FIG. 9a, a partial view of one embodiment of the positive single-edge latch 200 is illustrated. In this embodiment, an active delay circuit 400 is operatively connected between the output signal $D^+$ and the positive edge latched data signal $S^+$. The delay circuit 400 may be configured as a series connection of an inverter 410 and a capacitor-connected transistor 421. The capacitor-connected transistor may in some embodiments be referred to as a MOS capacitor. A corresponding partial view of one embodiment of the negative single-edge latch 300 is illustrated in FIG. 9b where the active delay circuit 400 is operatively connected between the output signal $D^-$ and the negative edge latched data signal $S^-$. Also this embodiment of the delay circuit 400 may be configured as a series connection of an inverter 410 and a capacitor-connected transistor 422. The delay circuit 400 is beneficial to reduce glitches occurring due to the drive transistors 240, 340 are set in high impedance state just before their state is being updated on the rising edge of the first clock signal $CLK_1$ after new data arrives on the data signal D. The drive transistor 240, 340 driving the output for the current state is turned off (see e.g. time point Δ in FIG. 5). When this happens, some charge is injected from the gate of this drive transistor 240, 340 to the drive signal S, i.e. the connection of the positive edge latched data signal S$^+$ to the negative edge latched data signal S$^-$. The charge is locked there until the second clock signal CLK$_2$ goes low (see e.g. time points E of in FIG. 5) and the drive signal S is actively driven to the new state. The glitch is data dependent and it may, when it is coupled to an output of the DAC cell 20 via DAC cell switches, generate distortion. The energy of this glitch is significantly reduced by injecting a corresponding charge in the opposite direction which is one effect of the delay circuit of FIGS. 9a and b. Preferably, the capacitor-connected transistor 421, 422 are sized such that the injected charge is substantially equal to the charge of the glitch. The delay circuit 400 of FIGS. 9a and b may be combined with any other embodiment of the positive single-edge latch 200 or the negative single-edge latch 300. As the skilled person will appreciate after digesting the teachings of this disclosure, the capacitor-connected transistor 421, 422 is but one embodiment and it may be replaced by any suitable capacitance configured to track the capacitance of the drive transistors 240, 340.

It should be mentioned that the delay through the inverters 410 is preferably adjusted such that the compensation charge is injected after the drive transistor 240, 340 have been fully turned off. Failure to accomplish this may lead to an uncontrolled amount of the compensation charge being shunted by the drive transistor 240, 340 rendering the compensation inaccurate. Due to this delay, it is likely that some small glitch energy remains. However, at the end of the compensation the total charge injection can be made small, preferably close to zero and ideally zero.

In addition to this, it should be noted that in FIGS. 9a and 9b, only the glitch before the falling edge is compensated at the drive signal S. This is because before the rising edge, the corresponding drive transistor 240, 340 is turned off and, therefore, its gate capacitance is small, and the glitch is not propagated to the output of the DAC 20. However, as the skilled person will appreciate after digesting the teachings of this disclosure, compensation of both rising and falling edge glitches may be made using the delay circuit of FIGS. 9a and 9b.

Figure 10B:
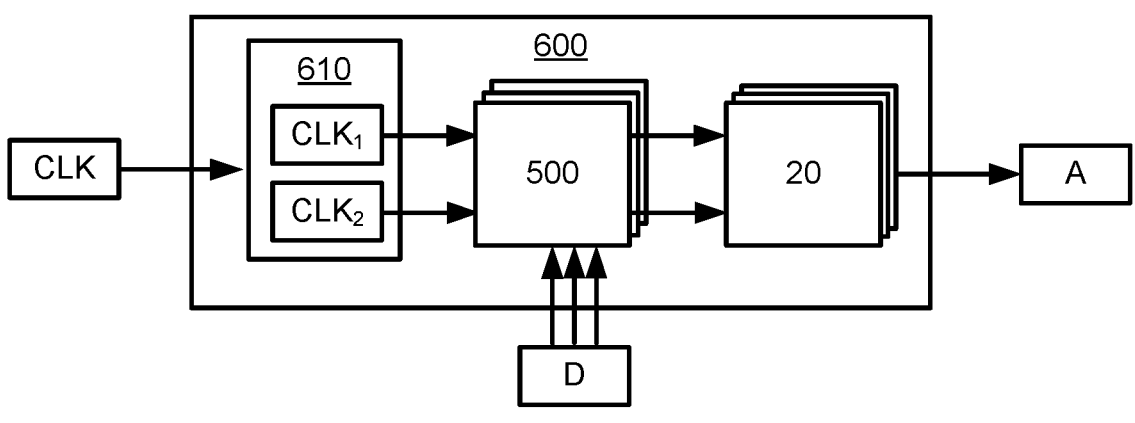

In FIG. 10a, a block diagram of a DAC 600 according to embodiments of the present disclosure is shown. The DAC 600 comprises one or more DAC-cells 20 wherein at least one DAC-cell 20 is controlled by a single ended driver circuit 100 of the DAC 600 according to any embodiment of the present disclosure. Preferably, the at least one DAC cell 20 is controlled by at least two single ended driver circuits 100 of the DAC 600 according to any embodiment of the present disclosure configured as the differential driver circuit 500. Each of the DAC-cells 20 is controlled by binary signals d$_n$, d$_{n+1}$, d$_{n+2}$, . . . , d$_{n+m}$, and/or groups of binary signals d$_n$, d$_{n+1}$, d$_{n+2}$, . . . , d$_{n+m}$ comprised in the data signal D. At least the single ended driver circuits 100 of the DAC 600 are controlled by the first clock signal CLK$_1$ and the second clock signal CLK$_2$. In one embodiment, as illustrated in FIG. 10b, the DAC 600 further comprises a clock distribution circuit 610. The clock distribution circuit is configured to provide the first clock signal CLK$_1$ and the second clock signal CLK$_2$ based on a main clock signal CLK provided to the DAC 600 and the clock distribution circuit 610.

FIG. 11 is a perspective view of an integrated circuit, IC, 700 according to embodiments of the present disclosure. The IC 700 comprises at least one single ended driver circuit 100 according to any embodiment of the present disclosure. Preferably, the IC 700 comprises the digital to analog converter 600 of FIG. 10a or 10b.

FIG. 12 is a schematic view of network node 800 according to embodiments of the present disclosure. The network node 800 comprises at least one single ended driver circuit 100 according to any embodiment of the present disclosure. Preferably, the network node 800 comprises the digital to analog converter 600 of FIG. 10a or 10b. In some embodiment, the network node 800 is a base station, BS, 800.

In FIG. 13, a schematic view of wireless device 900 according to embodiments of the present disclosure is shown. The wireless device 900 comprises at least one single ended driver circuit 100 according to any embodiment of the present disclosure. Preferably, the wireless device 900 comprises the digital to analog converter 600 of FIG. 10a or 10b. In some embodiment, the wireless device 900 is a user equipment, UE, 900.

Modifications and other variants of the described embodiments will come to mind to one skilled in the art having benefit of the teachings presented in the foregoing description and associated drawings. Therefore, it is to be understood that the embodiments are not limited to the specific example embodiments described in this disclosure and that modifications and other variants are intended to be included within the scope of this disclosure. For example, while embodiments of the invention have been described with reference to a driver for current steering DACs, persons skilled in the art will appreciate that the embodiments of the invention can equivalently be applied to any other driver circuit wherein signals are to be latched based on a clock. Furthermore, although specific terms may be employed herein, they are used in a generic and descriptive sense only and not for purposes of limitation. Therefore, a person skilled in the art would recognize numerous variations to the described embodiments that would still fall within the scope of the appended claims. Furthermore, although individual features may be included in different claims (or embodiments), these may possibly advantageously be combined, and the inclusion of different claims (or embodiments) does not imply that a combination of features is not feasible and/or advantageous. In addition, singular references d$_n$ not exclude a plurality. Finally, reference signs in the claims are provided merely as a clarifying example and should not be construed as limiting the scope of the claims in any way.

The invention claimed is:

1. A differential driver circuit configured for use in a digital to analog conversion (DAC) cell, wherein:

the differential driver circuit comprises a first single-ended driver circuit and a second single-ended driver circuit;

the first single-ended driver circuit is configured to receive a data signal;

the second single-ended driver circuit is configured to receive an inverse of the data signal; and each of the first and second single-ended driver circuits comprises the following:

a positive single-edge latch configured to receive the data signal or the inverse and to provide a positive edge latched data signal based on the received data signal or inverse, said latch comprising a high side drive transistor controlled by an output signal provided between a first high side transistor switch and a series connection of a first low side transistor switch and a second low side transistor switch, wherein:

the first high side transistor switch and the second low side transistor switch are configured to be controlled by the data signal or the inverse, and the first low side transistor switch is configured to be controlled by a first clock signal;

the first high side transistor switch is configured to be activated by a low state of the data signal or the inverse;

the second low side transistor switch is configured to be activated by a high state of the data signal or the inverse; and the first low side transistor switch is configured to be activated by a high state of the first clock signal, wherein the high side drive transistor is arranged to provide the positive edge latched data signal at an open drain terminal of the high side drive transistor; and a negative single-edge latch configured to receive the data signal or the inverse and to provide a negative edge latched data signal based on the received data signal or inverse, said latch comprising a low side drive transistor controlled by a negative output signal provided between a further first low side transistor switch and a series connection of a further first high side transistor switch and a further second high side transistor switch, wherein:

the further first high side transistor switch and the further first low side transistor switch are configured to be controlled by the data signal or the inverse, and the further second high side transistor switch is configured to be controlled by a second clock signal;

the further first high side transistor switch is configured to be activated by a low state of the data signal or the inverse;

the further first low side transistor switch is configured to be activated by a high state of the data signal or the inverse; and the further second high side transistor switch is configured to be activated by a low state of the second clock signal, wherein the low side drive transistor is arranged to provide the negative edge latched data signal at an open drain terminal of the low side drive transistor;

wherein the drain terminals of said high side drive transistor and said low side drive transistor are interconnected.

2. The differential driver circuit of claim 1, wherein for each of the first and second single-ended driver circuits, in the positive single-edge latch, the first low side transistor switch is arranged upstream of the second low side transistor switch.

3. The differential driver circuit of claim 1, wherein for each of the first and second single-ended driver circuits, the positive single-edge latch further comprises a second high side transistor switch operatively connected in parallel with the first high side transistor and the first low side transistor switch, wherein the second high side transistor switch is configured to be controlled by the data signal or the inverse.

4. The differential driver circuit of claim 1, wherein for each of the first and second single-ended driver circuits, in the negative single-edge latch, the first high side transistor switch is arranged upstream of the second high side transistor switch.

5. The differential driver circuit of claim 1, wherein for each of the first and second single-ended driver circuits, the negative single-edge latch further comprises a second low side transistor switch operatively connected in parallel with the second high side transistor and the first low side transistor switch, wherein the second low side transistor switch is configured to be controlled by the data signal or the inverse.

6. The differential driver circuit of claim 1, wherein for each of the first and second single-ended driver circuits, the second clock signal is inverted in relation to the first clock signal.

7. The differential driver circuit of claim 1, wherein for each of the first and second single-ended driver circuits, the second clock signal is delayed by a delay period in relation to the first clock signal.

8. The differential driver circuit of claim 7, wherein for each of the first and second single-ended driver circuits, the delay period is configurable.

9. The differential driver circuit of claim 1, wherein for each of the first and second single-ended driver circuits, in the positive single-edge latch, the first low side transistor switch is arranged upstream of the second low side transistor switch.

10. The differential driver circuit of claim 1, wherein:

for each of the first and second single-ended driver circuits, the positive single-edge latch further comprises a second high side transistor switch operatively connected in parallel with the first high side transistor and the first low side transistor switch;

for the first single-ended driver circuit, the second high side transistor switch is configured to be controlled by the data signal; and for the second single-ended driver circuit, the second high side transistor switch is configured to be controlled by the inverse D.

11. The differential driver circuit of claim 1, wherein for each of the first and second single-ended driver circuits, in the negative single-edge latch, the first high side transistor switch is arranged upstream of the second high side transistor switch.

12. The differential driver circuit of claim 1, wherein:

for each of the first and second single-ended driver circuits, the negative single-edge latch further comprises a second low side transistor switch operatively connected in parallel with the second high side transistor and the first low side transistor switch;

for the first single-ended driver circuit, the second low side transistor switch is configured to be controlled by the data signal; and for the second single-ended driver circuit, the second low side transistor switch is configured to be controlled by the inverse D.

13. A digital to analog converter comprising one or more digital-to-analog conversion (DAC) cells and the differential driver circuit of claim 1, wherein at least one of the DAC-cells is controlled by the differential driver circuit.

14. The digital to analog converter of claim 13, further comprising a clock distribution circuit configured to receive a main clock signal and to provide the first clock signal and the second clock signal based on the main clock signal.

15. An integrated circuit comprising the digital to analog converter of claim 13.

16. A network node comprising the digital to analog converter of claim 13.

17. A wireless device comprising the digital to analog converter of claim 13.

* * * * *